(12) United States Patent
Oosawa

(10) Patent No.: US 8,708,288 B2
(45) Date of Patent: Apr. 29, 2014

(54) CABLE FIXING STRUCTURE AND AUTOMATIC TELLER MACHINE

(75) Inventor: Toshimichi Oosawa, Gunma (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 90 days.

(21) Appl. No.: 13/062,988

(22) PCT Filed: Jul. 5, 2010

(86) PCT No.: PCT/JP2010/061406

§ 371 (c)(1),
(2), (4) Date: Mar. 9, 2011

(87) PCT Pub. No.: WO2011/027614

PCT Pub. Date: Mar. 10, 2011

(65) Prior Publication Data

US 2012/0153094 A1 Jun. 21, 2012

(30) Foreign Application Priority Data

Sep. 3, 2009 (JP) ................................. 2009-203339

(51) Int. Cl.
*F16B 15/00* (2006.01)

(52) U.S. Cl.
USPC .......................... 248/68.1; 248/74.1; 248/74.2

(58) Field of Classification Search
CPC ................................ H02G 3/32; F16B 7/0433
USPC .............. 248/68.1, 65, 74.3, 74.1, 69, 71, 73, 248/74.2

See application file for complete search history.

(56) References Cited

U.S. PATENT DOCUMENTS

| 4,669,688 | A | * | 6/1987 | Itoh et al. | 248/74.2 |
| 4,779,828 | A | * | 10/1988 | Munch | 248/74.3 |
| 5,758,002 | A | * | 5/1998 | Walters | 385/134 |
| 7,522,804 | B2 | * | 4/2009 | Araki et al. | 385/135 |
| 7,588,216 | B1 | * | 9/2009 | Hoyl et al. | 248/74.3 |
| 7,988,110 | B1 | * | 8/2011 | Liang et al. | 248/221.11 |
| 8,157,222 | B1 | * | 4/2012 | Shirey et al. | 248/74.1 |
| 8,215,595 | B2 | * | 7/2012 | Li | 248/74.2 |
| 2004/0178263 | A1 | * | 9/2004 | Jones et al. | 235/381 |

FOREIGN PATENT DOCUMENTS

| JP | 55-115088 U | 8/1980 |
| JP | 61-092111 A | 5/1986 |
| JP | 63-87881 U | 6/1988 |
| JP | 04-053194 A | 2/1992 |
| JP | 08-154325 A | 6/1996 |
| JP | 10-284858 A | 10/1998 |

* cited by examiner

*Primary Examiner* — Anita M King
(74) *Attorney, Agent, or Firm* — Rabin & Berdo, P.C.

(57) ABSTRACT

There is provided a cable fixing structure which improves actuation reliability of a device and facilitates decision of a wiring layout. The cable fixing structure A for fixing cables including a group of signal cables and a group of power cables includes: a support member; a first cable clamp which is mounted on the support member and in which a cable insertion hole for retaining the group of signal cables inserted therethrough is formed; and a second cable clamp which is mounted on the support member, in which a cable insertion hole for retaining the group of power cables inserted therethrough is formed, and which is disposed away from the first cable clamp in a direction intersecting an axial direction of the cables.

16 Claims, 6 Drawing Sheets

CABLE FIXING STRUCTURE AND AUTOMATIC TELLER MACHINE

TECHNICAL FIELD

The invention relates to a cable fixing structure for fixing cables and an automatic teller machine including the cable fixing structure.

BACKGROUND ART

As a cable fixing structure, a technique including a wiring groove having tapered surfaces inclined inward from a bottom section toward an opening section and extending in an axial direction and an elastically deformable cover to be inserted into the wiring groove is disclosed (see Japanese Patent Application Laid-Open (JP-A) No. 8-154325). By placing cables on the bottom section of the wiring groove, inserting the cover into the wiring groove, and engaging opposite end sections of the cover with the tapered surfaces of the wiring groove, the cables are pushed against the bottom section and fixed.

DISCLOSURE OF THE INVENTION

Problems to be Solved by the Invention

However, when a signal cable and a power cable, for example, are disposed in the wiring groove in the cable fixing structure described in the above document, these cables are disposed in contact with each other in the same wiring groove and therefore electromagnetic interference may occur between the signal cable and the power cable to cause malfunction of a device.

Moreover, when plural signal cables and plural power cables are disposed, these cables are disposed in the same wiring groove and therefore it is necessary to decide a wiring layout in consideration of positions where all of these cables are connected. As a result, decision of the wiring layout is difficult and it takes time of a worker, thereby reducing workability in assembly and maintenance. Moreover, the decision of the wiring layout is difficult and respective workers arbitrarily decide the wiring layouts based on their experience and intuition, which is likely to result in variations in the wiring layouts.

The invention has been made from the above viewpoint and is to provide a cable fixing structure which increases actuation reliability of a device and facilitates decision of a wiring layout.

Means for Solving Problem

In order to solve above problems, the invention relates to a cable fixing structure for fixing cables including a group of signal cables and a group of power cables, in which the structure includes: a support member; a first cable clamp which is mounted on the support member and in which a cable insertion hole to retain the group of signal cables inserted therethrough is formed; and a second cable clamp which is mounted on the support member, in which a cable insertion hole to retain the group of power cables inserted therethrough is formed, and which is disposed away from the first cable clamp in a direction intersecting an axial direction of the cables.

The group of signal cables refers to "the group of at least two signal cables" and the group of power cables refers to "the group of at least two power cables".

To be disposed away refers to "being disposed so that electromagnetic waves generated by the group of signal cables and the group of power cables do not interfere with each other".

According to the invention, because the cables include the group of signal cables and the group of power cables and the groups are inserted through and retained by the separate cable clamps to be disposed away from each other, electromagnetic interference between the group of signal cables and the group of power cables may be suppressed and actuation reliability of the device may be increased.

By dividing the cables into the group of signal cables and the group of power cables and respectively retaining the groups in bundles, the cables may be mounted after roughly divided into the group of signal cables and the group of power cables and therefore, compared to the conventional structure, it is easier to decide the wiring layout in a position where the cables are concentrated. This relieves a worker of trial and error, improves workability in assembly and maintenance, and moreover suppresses variations in the wiring layouts.

Effects of the Invention

According to the invention, actuation reliability of the device may be improved and the wiring layout may be decided easily.

BEST MODES FOR CARRYING OUT THE INVENTION

Figure 1:
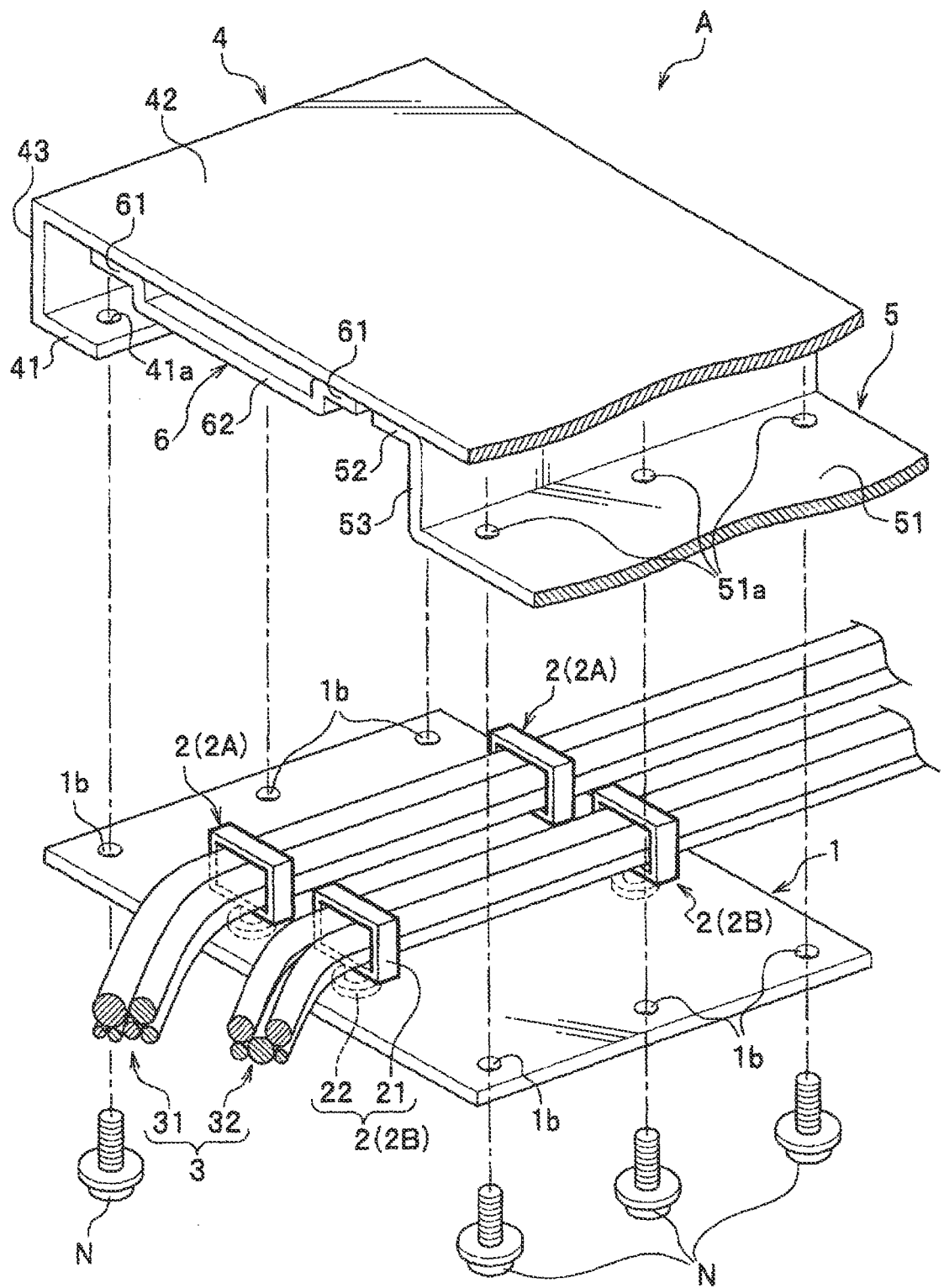
FIG. 1 is an exploded perspective view of a general configuration of a cable fixing structure according to a first exemplary embodiment.

Next, exemplary embodiments of the invention is described in detail by using the drawings. In the description, the same components are provided with the same reference numerals to avoid repetition of the description.

First Exemplary Embodiment

Figure 6:
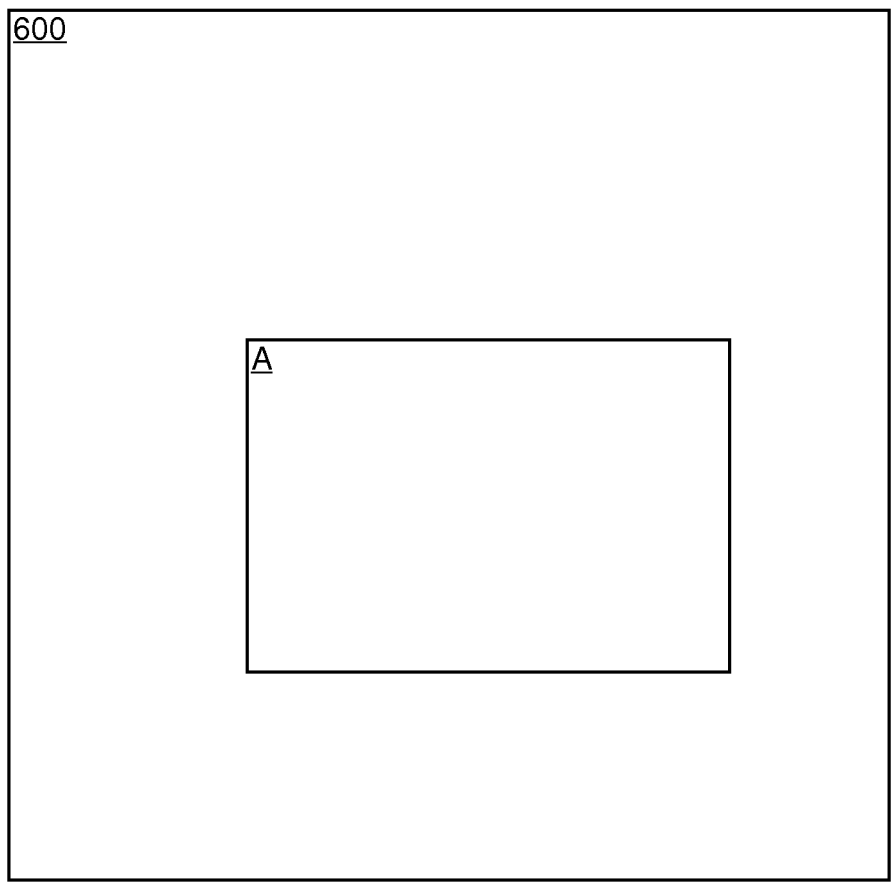
FIG. 6 is a view of a general configuration of a cable fixing structure according to embodiments of the present invention in an automatic teller machine.

A cable fixing structure A is a structure for fixing cables 3 disposed in a housing of an automatic machine 600 (see FIG. 6) such as an automatic teller machine (ATM), for example.

As shown in FIG. 1, the cable fixing structure A according to the first exemplary embodiment mainly includes a clamp bracket 1, cable clamps 2, a base cover 4, a base bracket 5, and a reinforcing bracket 6.

In the description, "an axial direction of the cables" and "a length direction of the cables" mean the same.

The clamp bracket 1 as a support member is a thin-plate-shaped member having a rectangular shape in a plan view as shown in FIG. 1 and has a function of preventing the cables 3 from bulging or bending to come in contact with a built-in unit (not shown). Plural mounting holes 1a, 1a . . . for mounting the cable clamps 2 are formed through the clamp bracket 1 at opposite end sides of a lateral direction of the clamp bracket 1 (see FIG. 2). Plural screw insertion holes 1b, 1b, . . . are formed through the clamp bracket 1 at opposite end sides of a longitudinal direction of the clamp bracket 1. Screws N for fastening the clamp bracket 1 to the base cover 4 and the base bracket 5 are inserted through the screw insertion holes 1b.

The cable clamps 2 are formed of elastic insulating members (e.g., synthetic resin). Each of the cable clamps 2 includes a rectangular cylindrical retaining section 21 and a mounting section 22 formed to protrude from and integrally with an outer face of the retaining section 21 as shown in FIGS. 1 and 2.

Figure 2:
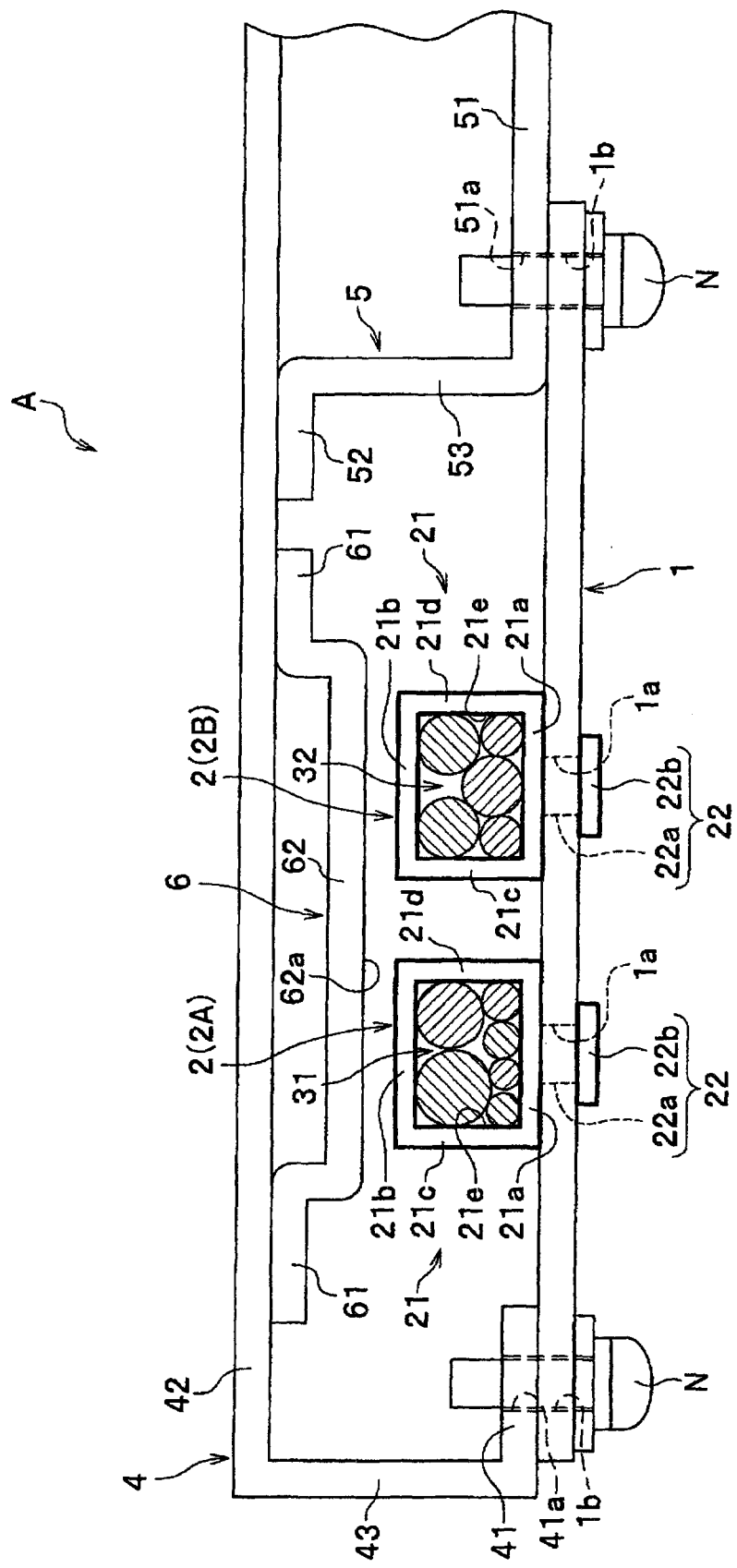
FIG. 2 is a front view of FIG. 1.

As shown in FIG. 2, the retaining section 21 includes a side wall 21a in contact with an inner face of the clamp bracket 1, a side wall 21b disposed away from and parallel to the side wall 21a, and side walls 21c and 21d connecting opposite end sections of the side wall 21a and the side wall 21b. A cable insertion hole 21e having a rectangular sectional shape is formed through in the middle of the side walls in an axial direction of the cables 3. A length of the cable insertion hole 21e parallel to the clamp bracket 1 is longer than a length in a direction that is normal (length of the cable insertion hole 21e perpendicular to the clamp bracket 1). The mounting section 22 includes a circular columnar shaft section 22a protruding from an outer face of the side wall 21a toward the clamp bracket 1 and a circular-plate-shaped head section 22b formed continuously from a tip end of the shaft section 22a. As shown in FIG. 2, the shaft section 22a is inserted into the mounting hole 1a and the head section 22b is engaged with an outer face (front face) of the cable clamp 2 so as to prevent the cable clamp 2 from coming off of the clamp bracket 1.

The plural cable clamps 2 (e.g., a total of four, two in respective rows and two in respective lines) having the above structures are mounted to the clamp bracket 1 as shown in FIG. 1. In other words, the cable clamps 2 includes a pair of first cable clamps 2A, 2A and a pair of second cable clamps 2B, 2B, the pair of second cable clamps 2B, 2B are arranged with predetermined spaces to the first cable clamps 2A in a direction intersecting (orthogonal to) the axial direction of the cables 3. The first cable clamps 2A, 2A are disposed linearly at an interval in the axial direction of the cables 3 to retain a group 31 of the signal cables inserted through the first cable clamps 2A, 2A (in a bundle). The second cable clamps 2B, 2B are disposed linearly at an interval in the axial direction of the cables 3 to retain a group 32 of the power cables inserted through the second cable clamps 2B, 2B (in a bundle). In the following description, the first cable clamps 2A and the second cable clamps 2B are simply referred to as the cable clamps 2.

The number of the cable clamps 2 is not limited to the above number and at least one cable clamp 2 may be mounted in the axial direction of the cables 3 and the cable clamps 2 may be mounted in at least two rows (a total of two) in the direction intersecting the axial direction of the cables 3. An opening area of the cable insertion hole 21e may be set suitably according to the number and the piling amount of cables 3.

Outer covers (coverings) of the cables 3 are formed of elastic materials. As shown in FIGS. 1 and 2, the cables 3 include the group 31 of signal cables containing the plural signal cables and the group 32 of power cables containing the plural power cables and are disposed while divided (separated) into those two groups. In other words, the group 31 of signal cables is inserted through and retained by the cable insertion holes 21e of the first cable clamps 2A, and the group 32 of power cables is inserted through and retained by the cable insertion holes 21e of the second cable clamps 2B and the groups 31 and 32 are disposed away from each other so as not to come in contact with each other. The group 31 of signal cables is fixed onto the clamp bracket 1 by the first cable clamps 2A, and the group 32 of power cables is fixed onto the clamp bracket 1 by the second cable clamps 2B.

The group 31 of signal cables and the group 32 of power cables may be inserted through the cable insertion holes 21e while allowed to move in the axial direction, or may be inserted through the cable insertion holes 21e while restrained from moving in the axial and radial directions. Although the cables 3 are disposed on each other in two layers in the cable insertion holes 21e of the cable clamps 2 in the exemplary embodiment, the manner in which the cables 3 are disposed is not limited to this. Instead, the cables 3 may be disposed in a layer, for example.

As shown in FIGS. 1 and 2, the base cover 4 is press formed from a plate and is disposed to cover inner faces (back faces) of the cable clamp 2. The base cover 4 includes a fixing section 41 extending along an inner face of the clamp bracket 1, a cover section 42 disposed away from and parallel to the fixing section 41, and a connecting section 43 connecting end sections of the fixing section 41 and the cover section 42. The fixing section 41 is disposed so as to face to one end side of the longitudinal direction of the clamp bracket 1, and internal threaded holes 41a are formed through on the fixing section 41 so as to correspond to the screw insertion holes 1b. The screws N for fastening the clamp bracket 1 to the base cover 4 are screwed into the internal threaded holes 41a. The cover section 42 is retained away from the clamp bracket 1 by the connecting section 43.

As shown in FIGS. 1 and 2, the base bracket 5 is press formed from a plate and has a function of increasing strength of the base cover 4. A shown in FIG. 2, the base bracket 5 has a crank sectional shape, is disposed on an opposite side from the fixing section 41 and the connecting section 43 of the base cover 4 while the cable clamps 2 being provided between the base bracket 5 and the fixing section 41. The base bracket 5 is disposed between the clamp bracket 1 and the cover section 42. The base bracket 5 includes a fixing section 51 extending along the inner face of the clamp bracket 1, a joint section 52 disposed away from and parallel to the fixing section 51, and a connecting section 53 connecting end sections of the fixing section 51 and the joint section 52.

As shown in FIG. 2, the fixing section 51 has a base end side disposed on the other end side of the clamp bracket 1 in the longitudinal direction and a tip end side extending farther outward than the clamp bracket 1. Internal threaded holes 51a are formed through on the fixing section 51 so as to correspond to the screw insertion holes 1b. The screws N for fastening the clamp bracket 1 to the base bracket 5 are screwed into the internal threaded holes 51a. The joint section 52 is extending along an inner face of the cover section 42 and is fixed to the cover section 42 by welding, for example. A means for fixing the base bracket 5 to the base cover 4 is not limited to this. Instead, screws or an adhesive may be used, for example.

As shown in FIGS. 1 and 2, the reinforcing bracket 6 is press formed from a plate and has a function of preventing the cables 3 from bulging or bending toward the base cover 4. The reinforcing bracket 6 has a hat shape in a sectional view and is disposed between the cables 3 and the cover section 42. The reinforcing bracket 6 includes a pair of joint sections 61, 61 extending along the inner face of the base cover 4 and disposed away from each other and a protruding section 62 protruding toward the clamp bracket 1 from inner edge sections of the pair of joint sections 61, 61.

As shown in FIG. 2, the joint sections 61 are fixed to the cover section 42 by welding, for example. A means for fixing the reinforcing bracket 6 to the base cover 4 is not limited to this. Instead, screws or an adhesive may be used, for example. At a tip end of the protruding section 62, a flat section 62a parallel to the clamp bracket 1 is formed. The flat section 62a is formed as a horizontal face and is close to the cables 3. Next, an example of assembly work of the cable fixing structure A is described with reference to FIGS. 1 and 2.

First, the mounting section 22 of each of the cable clamps 2 is inserted into the mounting hole 1a in the clamp bracket 1. When the mounting section 22 is inserted into the mounting hole 1a, the head section 22b of the mounting section 22 contracts toward a center due to its elasticity. After the head section 22b passes through the mounting hole 1a, the head section 22b returns to its original state to be engaged with the outer face of the clamp bracket 1.

Next, the group 31 of signal cables is inserted through the first cable clamps 2A, 2A and the group 32 of power cables is inserted through the second cable clamps 2B, 2B. As a result, the group 31 of signal cables and the group 32 of power cable are fixed to the clamp bracket 1 by the cable clamps 2.

Then, the clamp bracket 1 is disposed so that the internal threaded holes 41a in the base cover 4 and the internal threaded holes 51a in the base bracket 5 communicate with the screw insertion holes 1b in the clamp bracket 1. The screws N are inserted through the screw insertion holes 1b in the clamp bracket 1, screwed into the internal threaded holes 41a in the base cover 4 and the internal threaded holes 51a in the base bracket 5, and fastened. As a result, the clamp bracket 1 is fixed to the base bracket 5.

With the cable fixing structure A according to the first exemplary embodiment described above, the cables 3 are divided into the group 31 of signal cables and the group 32 of power cables, the groups of cables are respectively inserted through and retained by the separate cable clamps 2 and disposed away from each other. In this way, electromagnetic interference between the group 31 of signal cables and the group 32 of power cables may be suppressed and actuation reliability of the automatic machine may be improved.

By dividing the cables 3 into the group 31 of signal cables and the group 32 of power cables and respectively retaining the groups 31 and 32 in bundles, the cables 3 may be mounted after roughly divided into the group 31 of signal cables and the group 32 of power cables and therefore, compared to the conventional structure, it is easier to decide the wiring layout in a position where the cables are concentrated. This relieves a worker of trial and error, improves workability in assembly and maintenance, and suppresses variations in wiring layouts.

Because the group 31 of signal cables and the group 32 of power cables are inserted through the cable insertion holes 21e while allowed to move in the axial direction, and the sides of the cable insertion hole 21e parallel to the clamp bracket 1 are longer than the sides in the direction that is normal to the clamp bracket 1, elastic deformation amounts of the group 31 of signal cables and the group 32 of power cables when the groups are bent due to compression may be made smaller in a direction of the longer sides of the cable insertion hole 21e than in a direction of the shorter sides of the cable insertion hole 21e. Therefore, the group 31 of signal cables and the group 32 of power cables are retained at a certain interval without coming in contact with each other.

In a case that the group 31 of signal cables and the group 32 of power cables are inserted through the cable insertion holes 21e of the cable clamps 2 while restrained from moving in the axial direction and the radial direction with respect to the clamp bracket 1, the group 31 of signal cables and the group 32 of power cables are reliably retained by (fixed to) the clamp bracket 1 at the certain interval without coming in contact with each other.

Second Exemplary Embodiment

Next, a second exemplary embodiment of the invention is described with reference to FIG. 3. In the description, differences from the first exemplary embodiment are described in detail and the same components as those in the first exemplary embodiment is provided with the same reference numerals as those in the first exemplary embodiment to avoid repetition of the description. The second exemplary embodiment is different from the above first exemplary embodiment in that the reinforcing bracket 6 is omitted and that the clamp bracket 1 includes flange sections 11, 11 and a protruding section 12.

Figure 3:
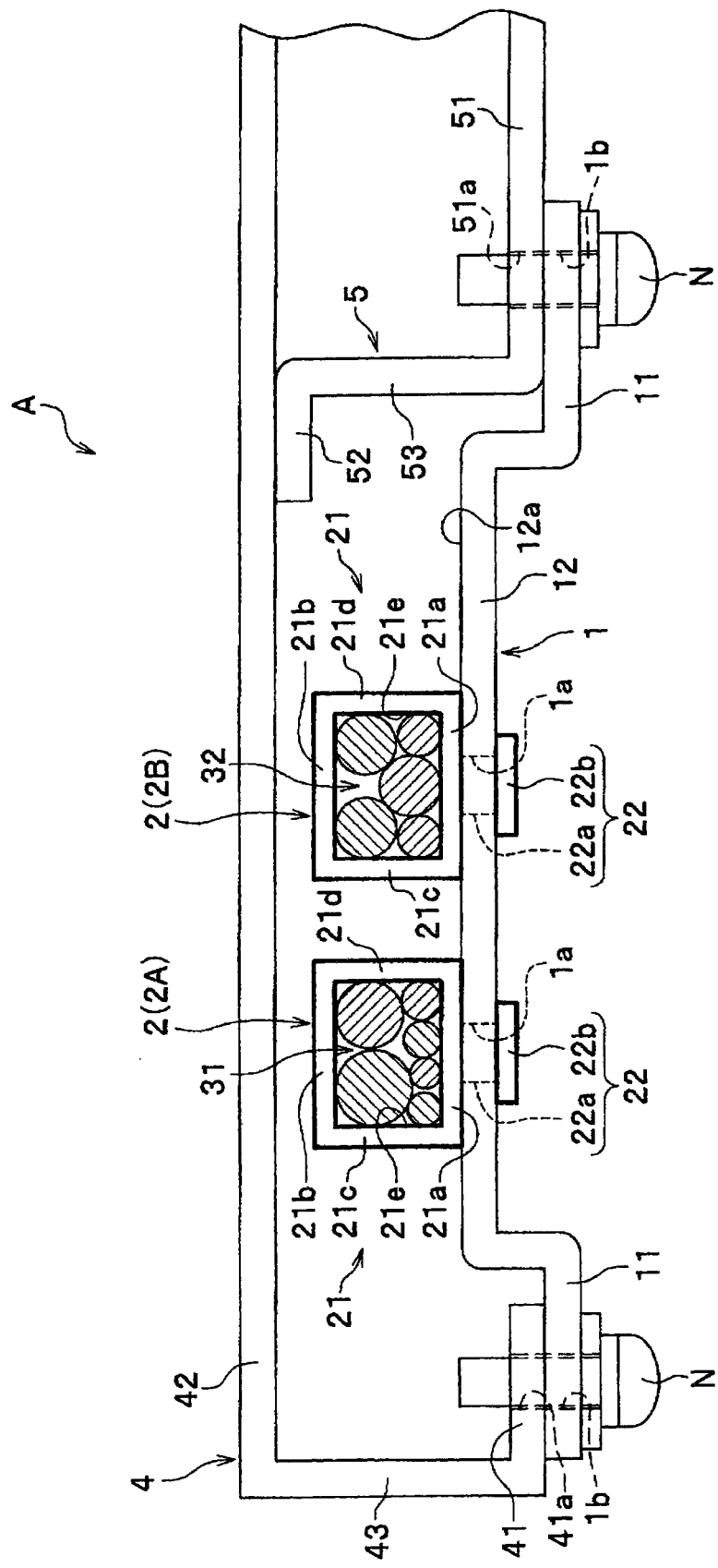
FIG. 3 is a front view of a configuration of a cable fixing structure according to a second exemplary embodiment.

As shown in FIG. 3, the clamp bracket 1 is press formed from a plate and has a hat shape in a sectional view. The clamp bracket 1 includes the pair of flange sections 11, 11 formed throughout lengths of opposite ends in the longitudinal direction and the protruding section 12 protruding toward the base cover 4 from inner edge sections of the pair of flange sections 11, 11.

The plural screw insertion holes 1b, 1b, . . . are respectively formed through the flange sections 11, 11. The screws N for fastening the clamp bracket 1 to the base cover 4 and the base bracket 5 are inserted through the screw insertion holes 1b. The plural mounting holes 1a, 1a, . . . for mounting the cable clamps 2 are formed through the protruding section 12 on opposite end sides in the axial direction of the cables 3. A flat section 12a which is parallel to the cover section 42 and to which the cable clamps 2 are to be mounted is formed at a tip end of the protruding section 12. The flat section 12a is formed as a horizontal face. Because the protruding section 12 is formed, the cables 3 are close to the cover section 42.

With the cable fixing structure A according to the second exemplary embodiment described above, by forming the protruding section 12 protruding toward the base cover 4 on the clamp bracket 1, the cables 3 are close to the cover section 42 of the base cover 4. The cover section 42 may prevent the cables 3 from bulging (bending) toward the base cover 4 and it is unnecessary to provide the reinforcing bracket 6, which may reduce the number of parts as compared with the first exemplary embodiment.

Third Exemplary Embodiment

Figure 4:
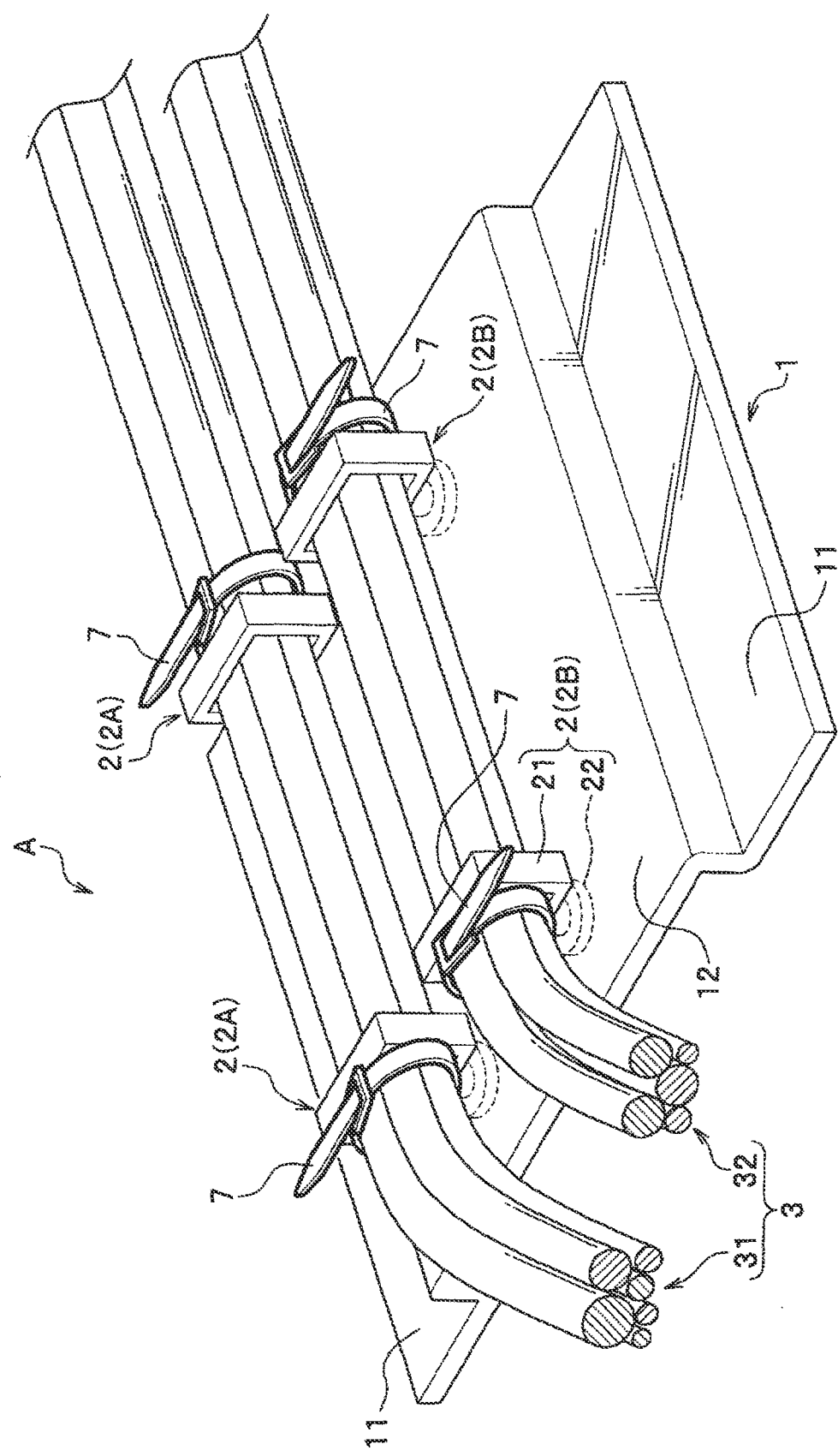
FIG. 4 is a perspective view of a general configuration of a cable fixing structure according to a third exemplary embodiment.
Figure 5:
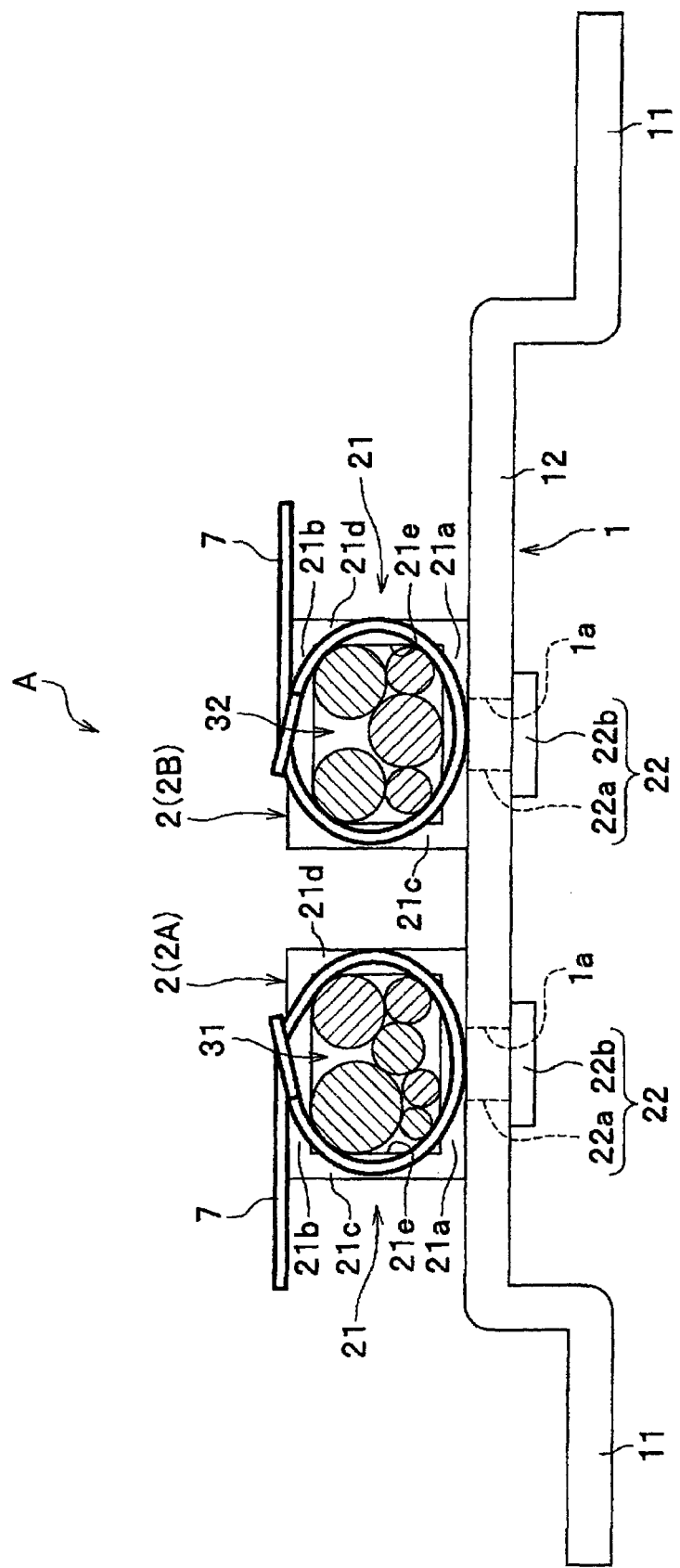
FIG. 5 is a front view of FIG. 4.

Next, a third exemplary embodiment of the invention is described with reference to FIGS. 4 and 5. In the description, differences from the first exemplary embodiment and the second exemplary embodiment are described in detail and the same components as those in the first exemplary embodiment and the second exemplary embodiment are provided with the same reference numerals as those in the first exemplary embodiment and the second exemplary embodiment to avoid repetition of the description. The third exemplary embodiment is different from the above first and the second exemplary embodiments in that the screw insertion holes 1b in the clamp bracket 1, the base cover 4, and the base bracket 5 are omitted and that the cables 3 are banded with bands 7.

The bands 7 are made of synthetic resin, for example. As shown in FIG. 4, the bands 7 bundle the group 31 of signal cables and the group 32 of power cables at two positions, respectively. In other words, the bands 7 are positioned outside the cable clamps 2 in the axial direction of the cables 3

(on sides of end edges of the protruding section 12) to bundle the group 31 of signal cables and the group 32 of power cables, respectively.

With the cable fixing structure A according to the third exemplary embodiment described above, the group 31 of signal cables and the group 32 of power cables may be respectively bundled more tightly by using the bands 7.

Although the exemplary embodiments of the invention are described above, it is needless to say that changes may be made suitably without departing from the gist of the invention. Although the cable fixing structure A of the exemplary embodiments is applied to the housing of the automatic machine, the structure A may be applied not only to this but also to other devices in which plural cables of different systems are disposed.

The invention claimed is:

1. A cable fixing structure for fixing cables including a group of signal cables and a group of power cables, the structure comprising:
   a support member;
   a first cable clamp which is mounted on the support member, the first cable clamp having a cable insertion hole to retain the group of signal cables;
   a second cable clamp which is mounted on the support member, the second cable clamp having a cable insertion hole to retain the group of power cables, the second cable clamp being disposed away from the first cable clamp in a direction intersecting an axial direction of the groups of signal and power cables; and
   a reinforcing bracket being disposed opposite the support member so that both of the first and second cable clamps are between the reinforcing bracket and the support member, the reinforcing bracket being proximate to the group of signal cables and the group of power cables.

2. The cable fixing structure of claim 1, wherein each cable insertion hole has a rectangular sectional shape, and sides of each cable insertion hole, that are parallel to the support member, are longer than sides of the cable insertion hole that are disposed in a direction that is normal to the support member.

3. The cable fixing structure of claim 1, further comprising bands for respectively bundling the group of signal cables and the group of power cables.

4. The cable fixing structure of claim 1, wherein the reinforcing bracket has a protruding section that is disposed proximate to both of the group of signal cables and the group of power cables.

5. The cable fixing structure of claim 1, wherein the reinforcing bracket prevents the power and signal cables from bulging or bending past the reinforcing bracket.

6. The cable fixing structure of claim 1, further comprising a base cover attached to the reinforcing bracket so that the base cover, the reinforcing bracket, the first cable clamp, and the support member are arranged in that stated order along a straight line.

7. The cable fixing structure of claim 6, wherein the reinforcing bracket prevents the power and signal cables from bulging or bending toward the base cover.

8. The cable fixing structure of claim 1, further comprising a base cover attached to the reinforcing bracket so that the base cover, the reinforcing bracket, the second cable clamp, and the support member are arranged in that stated order along a straight line.

9. The cable fixing structure of claim 8, wherein the reinforcing bracket prevents the power and signal cables from bulging or bending toward the base cover.

10. The cable fixing structure of claim 1, wherein in a view in the axial direction of the power and signal cables, the reinforcing bracket is disposed directly above each of the first cable clamp, the second cable clamp and the power and signal cables.

11. A cable fixing structure for fixing cables including a group of signal cables and a group of power cables, the structure comprising:
    a support member;
    a first cable clamp which is mounted on the support member, the first cable clamp having a cable insertion hole to retain the group of signal cables;
    a second cable clamp which is mounted on the support member, the second cable clamp having a cable insertion hole to retain the group of power cables, the second cable clamp being disposed away from the first cable clamp in a direction intersecting an axial direction of the groups of signal and power cables; and
    a base cover having a cover section disposed on an opposite side from the support member with the first cable clamp and the second cable clamp being provided between the base cover and the support member,
    wherein the support member includes a protruding section protruding toward the base cover,
    the first cable clamp and the second cable clamp are mounted to the protruding section, and
    the group of signal cables and the group of power cables are provided to be close to the base cover.

12. The cable fixing structure of claim 11, wherein each cable insertion hole has a rectangular sectional shape, and sides of each cable insertion hole, that are parallel to the support member, are longer than sides of the cable insertion hole that are disposed in a direction that is normal to the support member.

13. The cable fixing structure of claim 11, further comprising bands for respectively bundling the group of signal cables and the group of power cables.

14. An automatic teller machine comprising:
    a cable fixing structure for fixing cables including a group of signal cables and a group of power cables, the structure comprising:
    a support member;
    a first cable clamp which is mounted on the support member, the first cable clamp having a cable insertion hole to retain the group of signal cables;
    a second cable clamp which is mounted on the support member, the second cable clamp having a cable insertion hole to retain the group of power cables, the second cable clamp being disposed away from the first cable clamp in a direction intersecting an axial direction of the groups of signal and power cables.

15. The automatic teller machine of claim 14, wherein each cable insertion hole has a rectangular sectional shape, and sides of each cable insertion hole, that are parallel to the support member, are longer than sides of the cable insertion hole that are disposed in a direction that is normal to the support member.

16. The automatic teller machine of claim 14, further comprising bands for respectively bundling the group of signal cables and the group of power cables.

* * * * *